(12) United States Patent
De Santa et al.

(10) Patent No.: US 12,506,053 B2
(45) Date of Patent: Dec. 23, 2025

(54) METHOD OF ASSEMBLING SEMICONDUCTOR DEVICES AND CORRESPONDING SEMICONDUCTOR DEVICE

(71) Applicant: STMicroelectronics S.r.l., Agrate Brianza (IT)

(72) Inventors: Matteo De Santa, Lombardia (IT); Mirko Alesi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 748 days.

(21) Appl. No.: 17/873,749

(22) Filed: Jul. 26, 2022

(65) Prior Publication Data

US 2023/0032786 A1 Feb. 2, 2023

(30) Foreign Application Priority Data

Jul. 30, 2021 (IT) .................. 102021000020552

(51) Int. Cl.
*H01L 23/495* (2006.01)
*H01L 23/00* (2006.01)
*H01L 25/07* (2006.01)

(52) U.S. Cl.
CPC .. *H01L 23/49524* (2013.01); *H01L 23/49562* (2013.01); *H01L 23/49575* (2013.01);
(Continued)

(58) Field of Classification Search
CPC ......... H01L 23/49524; H01L 23/49562; H01L 23/49575; H01L 24/48; H01L 24/49;
(Continued)

(56) References Cited

U.S. PATENT DOCUMENTS

2007/0108601 A1 5/2007 Ong et al.
2012/0119343 A1 5/2012 Bayan et al.
(Continued)

FOREIGN PATENT DOCUMENTS

| CN | 101692444 A | 4/2010 |
|---|---|---|
| CN | 203882995 U | 10/2014 |
| CN | 218957727 U | 5/2023 |

OTHER PUBLICATIONS

IT Search Report and Written Opinion for priority application, IT 102021000020552, report dated Apr. 19, 2022, 8 pgs.
(Continued)

*Primary Examiner* — Robert G Bachner
(74) *Attorney, Agent, or Firm* — Crowe & Dunlevy LLC

(57) ABSTRACT

A leadframe includes a die pad having arranged thereon a first semiconductor die with an electrically conductive ribbon extending on the first semiconductor die. The first semiconductor die lies intermediate the leadframe and the electrically conductive ribbon. A second semiconductor die is mounted on the electrically conductive ribbon to provide, on the same die pad, a stacked arrangement of the second semiconductor die and the first semiconductor die with the at least one electrically conductive ribbon intermediate the first semiconductor die and the second semiconductor die. Package size reduction can thus be achieved without appreciably affecting the assembly flow of the device.

22 Claims, 4 Drawing Sheets

(52) U.S. Cl.
CPC .............. *H01L 24/48* (2013.01); *H01L 24/49* (2013.01); *H01L 25/074* (2013.01); *H01L 2224/48137* (2013.01); *H01L 2224/48247* (2013.01); *H01L 2224/4903* (2013.01)

(58) Field of Classification Search
CPC ......... H01L 25/074; H01L 2224/48137; H01L 2224/48247; H01L 2224/4903; H01L 24/06; H01L 24/32; H01L 24/37; H01L 24/83; H01L 24/85; H01L 24/84; H01L 24/73; H01L 2224/04034; H01L 2224/04042; H01L 2224/05553; H01L 2224/05554; H01L 2224/32245; H01L 2224/37147; H01L 2224/40175; H01L 2224/41113; H01L 2224/48145; H01L 2224/49171; H01L 2224/8385; H01L 2224/92247; H01L 24/40; H01L 24/41; H01L 2224/49175; H01L 2224/73221; H01L 25/16; H01L 2224/0603; H01L 2224/40245; H01L 2224/84205; H01L 2924/00014; H01L 23/49861

See application file for complete search history.

(56) References Cited

U.S. PATENT DOCUMENTS

| | | | |
|---|---|---|---|
| 2012/0326287 A1* | 12/2012 | Joshi | ................. H01L 24/41 257/676 |
| 2015/0187684 A1 | 7/2015 | Myung et al. | |
| 2020/0176371 A1 | 6/2020 | Ise et al. | |

OTHER PUBLICATIONS

CN First Office Action and Search Report for counterpart CN Appl. No. 202210909307.8, report dated Jul. 29, 2025, 7 pgs.

\* cited by examiner

METHOD OF ASSEMBLING SEMICONDUCTOR DEVICES AND CORRESPONDING SEMICONDUCTOR DEVICE

PRIORITY CLAIM

This application claims the priority benefit of Italian Application for Patent No. 102021000020552, filed on Jul. 30, 2021, the content of which is hereby incorporated by reference in its entirety to the maximum extent allowable by law.

TECHNICAL FIELD

The description relates to semiconductor devices.

One or more embodiments can be advantageously applied to power semiconductor devices.

BACKGROUND

In various power semiconductor devices (including, for instance, power semiconductor devices in a Quad-Flat No-leads (QFN) package) one or more power integrated circuit chips or dice are arranged side-by-side with a driver integrated circuit chip or die manufactured, for instance, using BCD (Bipolar-CMOS-DMOS) technology.

These chips (or dice: the terms "chip" and "die" are used herein as synonyms) can be mounted on respective adjacent die pads or paddles in a leadframe.

Wire bonding is used to provide die-to-die or die-to-leadframe connections (e.g., signals, ground) and so-called "ribbons" wedge-bonded to the leadframe leads are used to provide conductive lines or paths suited for carrying high currents.

In such an arrangement, a substantial amount of substrate (leadframe) space is taken by distinct die pads or paddles used for mounting the various power and driver chips or dice.

There is a need in the art to contribute in adequately dealing with such an issue.

SUMMARY

One or more embodiments relate to a method.

One or more embodiments relate to a corresponding semiconductor device. A semiconductor device such as a power device comprising plural, mutually coupled semiconductor integrated circuit chips or dice may be exemplary of such a device.

One or more embodiments involve stacking at least one die (a driver or controller die, for instance) onto another die (a power die, for instance) by using one or more ribbon sections for attachment.

In that way, the overall package height is (slightly) increased with the increase largely compensated for by a notable reduction in package footprint. This may result in smaller leadframes, smaller packages as well as a reduced footprint on final mounting to substrates such as printed circuit board (PCBs).

One or more embodiments thus rely on an unexpected recognition that ribbons such as conventionally used to provide current channels or paths in semiconductor power devices are strong enough to support adequately one or more semiconductor chips attached thereon.

One or more embodiments offer one or more of the following advantages: compatibility with existing wire bonding machines; a plug & play process is provided, wherein the number of assembly steps remains substantially unchanged; wide applicability to several leadframe packages; package size reduction; cost savings due to package size reduction; and selectivity due to the capability of customizing wires and ribbons according to desired specifications.

As is the case in arrangements comprising stacked chips, a certain chip (for instance a smaller one) can be placed "on top" of at least another chip by using a ribbon arranged there between as a support structure.

One or more embodiments thus facilitate reducing the overall X and Y dimensions of a semiconductor chip package with the capability of taking advantage of a possible synergic combination of die bonding, wire bonding and ribbon bonding (plus chip or die stacking) in manufacturing semiconductor devices.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment.

Furthermore, particular configurations, structures, or characteristics may be combined in any adequate way in one or more embodiments.

The headings/references used herein are provided merely for convenience and hence do not define the extent of protection or the scope of the embodiments.

Figure 2:
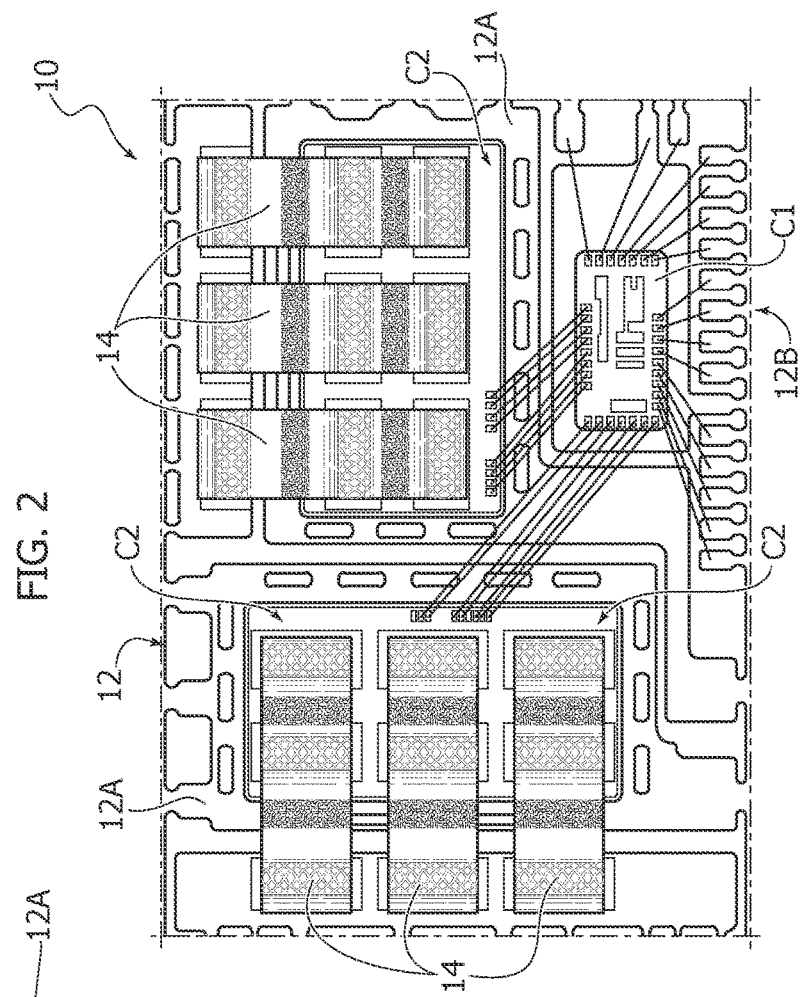
FIGS. 1 and 2 are plan views of semiconductor devices comprising plural semiconductor chips arranged on a substrate with ribbons providing power connection channels or paths.
Figure 1:
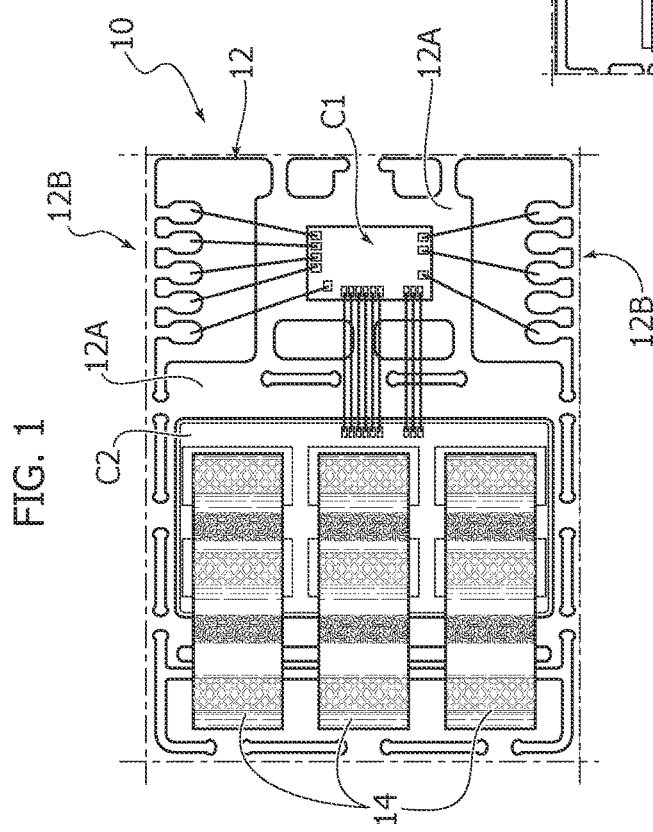

Semiconductor devices 10 as exemplified in FIGS. 1 and 2 may comprise plural semiconductor integrated circuit chips (or dice) C1, C2 arranged, whatever their number and functions, at respective adjacent die pads or paddles 12A in a substrate 12 such as leadframe.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations (leads) 12B that extend from an outline location inwardly in the direction of a semiconductor chip or die thus forming an array of electrically-conductive formations from one or more die pads or paddles 12A configured to have at least one semiconductor chip or die attached thereon.

Attachment of the at least one semiconductor chip or die to the die paddle may be made via known material such as a die attach adhesive (a die attach film or DAF, for instance).

Leadframes are conventionally created using technologies such as a photo-etching technology. With this technology, metal (e.g., copper) material in the form of a foil or tape is etched on the top and bottom sides to create various pads and leads.

Substrates such as leadframes are advantageously provided in a pre-molded version wherein an insulating resin (an epoxy resin, for instance) fills the empty spaces between the die pads 12A and leads 12B.

A pre-molded leadframe 12 is thus a laminar substrate that is substantially flat with the pre-mold material (resin) filling the spaces in the electrically conductive structure (of metal material such as copper, for instance) of the leadframe, that has been bestowed a sculptured appearance including empty spaces during forming, by etching, for instance.

The total thickness of the pre-mold leadframe is the same thickness of the sculptured electrically conductive structure.

In FIGS. 1 and 2, reference 14 indicates so-called "ribbons" (namely narrow strips of electrically conductive materials—copper may be exemplary of such material) providing electrically conductive lines extending over the power dice C2 and configured to carry currents from the power dice C2 to one or more electrical loads (not visible in the figures).

As illustrated in FIGS. 1 and 2, the ribbons 14 may exhibit a wavy (undulated) pattern that facilitates welding through ultrasonic bonding.

Power packages as exemplified in FIGS. 1 and 2 thus include at least two chips or dice.

These may include, for instance, one or more "power" dice C2—that provide the power section of the device 10—and at least one smaller die C1 acting as a controller and connected both to the power die or dice C2 and to the external leads 12B in the substrate (leadframe) 12.

As noted, ribbons such as 14 are primarily used for "heavy duty" lines while the controller die or dice C1 are usually wire bonded with thin wire.

In conventional arrangements as illustrated in FIGS. 1 and 2, each die C1, C2 is arranged on a respective die paddle 12A.

Consequently, the final package dimensions are dictated by the number and dimensions of the die paddles provided to host the dice C1, C2.

From a package perspective, this translates into a larger package size as the number of dice increases as is currently the case with power applications comprising multi-die packages.

Stated otherwise, in arrangements like that illustrated in FIGS. 1 and 2—where the dice C1, C2 are arranged mutually adjacent—an increased number of dice C1, C2 leads to more space required and larger X and Y dimensions of the device package, with the final package dimensions inevitably increased.

In a complementary manner, the number of die mounting positions available in a leadframe is directly linked to the sizes of the individual dice and a higher number of positions becomes available in a leadframe only in the presence of dice of smaller size.

If the dice have a smaller size, the positions available in a leadframe can increase, but are still limited by the device package dimension that is linked to the number of dice for each device.

The final package cost is linked to the package size.

The possibility of stacking chips or dice (e.g., by stacking a smaller die "on top" of a larger die) is well known in the art.

On the other hand, looking at FIGS. 1 and 2, and thinking of, e.g., stacking the die C1 on the or one of the dice C2 one would inevitably conclude that the ribbons 14 that extend over the dice C2 militate against such a solution.

This is particularly the case if one considers the general wavy pattern bestowed upon the ribbons 14 in order to facilitate welding thereof, e.g., through ultrasonic bonding.

Contrary to such expectations, the inventors have discovered that the ribbons 14 used in manufacturing power semiconductor devices as illustrated in FIGS. 1 and 2 can be rendered strong (rigid and resistant) enough to be used as mounting surfaces for semiconductor dice such as a drive die C1.

This may be particularly the case if (as illustrated in figures starting from FIG. 3 onwards) the ribbon 14 or each of the ribbons 14 used for mounting a die C1 thereon are shaped (in a manner otherwise known to those of skill in the art of ribbon bonding) in such a way to exhibit a planar surface as exemplified at 14A in FIGS. 3 to 7.

It is again noted that throughout these figures, parts or elements like or similar to parts or elements already discussed in connection with FIGS. 1 and 2 are indicated with the same reference symbols: a corresponding detailed description will not be repeated for brevity.

Figure 3:
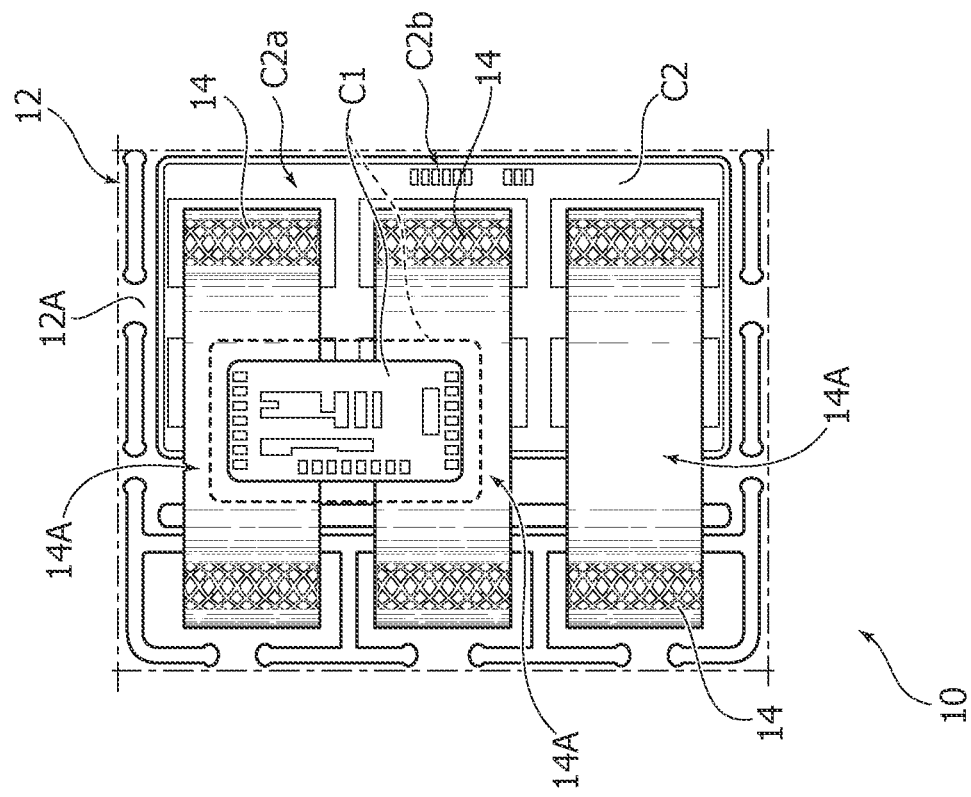
FIG. 3 is a plan view of a semiconductor device according to embodiments of the present description.

FIG. 3 is illustrative of the possibility of mounting (attaching) a smaller integrated circuit die such as the controller die C1 on a such planar ribbon surface 14A.

This may occur via a conventional attachment material ("glue") as known to those of skill in the art.

FIG. 3 is illustrative of a die C1 of smaller size capable of being completely accommodated over a planar surface 14A provided in a single one of the ribbons 14.

By comparing FIG. 3 with FIG. 1 one may note that, with the die C1 mounted on one of the ribbons 14 in turn extending over the die or dice C2—as illustrated in FIG. 3—the portion of the substrate (lead frame) 12 that in FIG. 1 hosts the die C1 (including the die pad 12A on the right hand of the figure) is no longer used for mounting the die C1.

That portion of the substrate (lead frame) 12 can be eliminated or used for another purpose as discussed in connection with FIG. 7.

Figure 4:
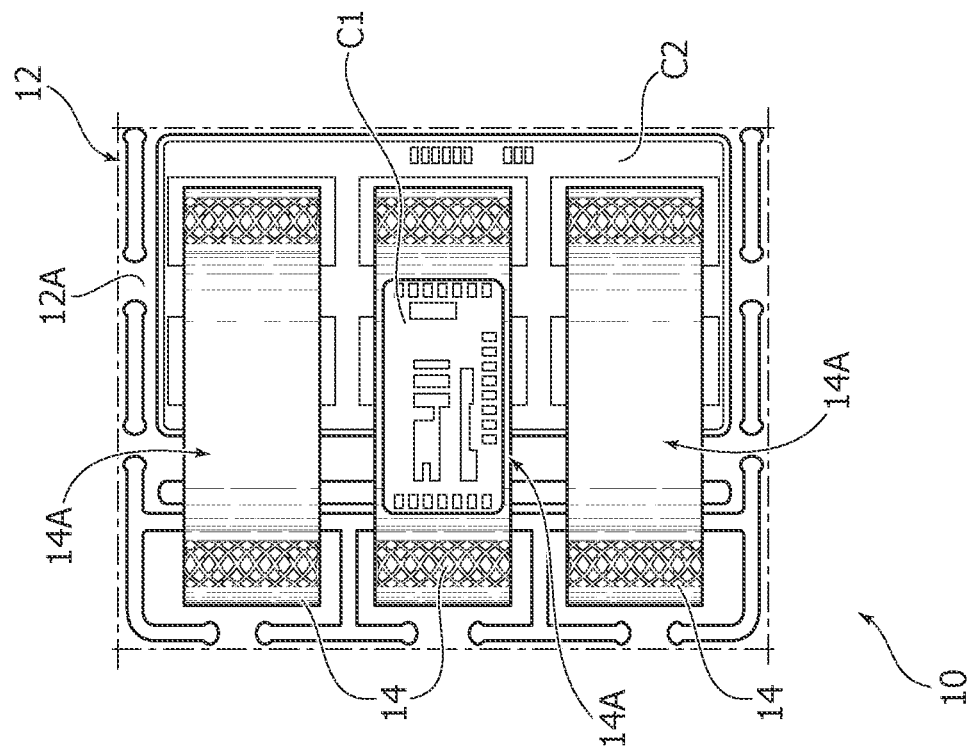
FIG. 4 is a plan view of another semiconductor device according to embodiments of the present description.

FIG. 4 is exemplary of the fact that the size of the die C1 arranged (attached) on the ribbons 14 is not strictly binding in so far as a (e.g., relatively larger) die as C1 illustrated in dashed outline, can be mounted "astride" or "bridge-like" across two neighboring ribbons 14 (e.g., between two respective planar portions 14A).

Dice such as C1 can be bonded on top of ribbons 14 using attach materials such as glue or adhesive tape, which may be conductive or non-conductive, depending on the desired application.

A bridge-like mounting as exemplified in FIG. 4 can be exploited (e.g., using electrically conductive material to attach the die C1 on the ribbons 14) to create an electrically conductive path coupling two neighboring ribbons 14. Such an arrangement is disclosed in U.S. patent application Ser. No. 17/848,958, filed Jun. 24, 2022 (claiming priority from Italian patent application 102021000017207 filed Jun. 30, 2021), the disclosure of which is incorporated by reference. It is further possible that the neighboring ribbons are associated with two different dice C2a and C2b (as generally indicated by the arrows). In other words, a pair of adjacent semiconductor dice C2a and C2b are arranged with a pair of electrically conductive ribbons 14 such one electrically conductive ribbon extends on a corresponding one of the semiconductor dice. The semiconductor die C1 is then attached bridge-like across said electrically conductive ribbons in said pair of electrically conductive ribbons. Each one of the semiconductor dice C2a, C2b then lies intermediate the substrate and a respective electrically conductive ribbon in the pair of electrically conductive ribbons.

Figure 5:
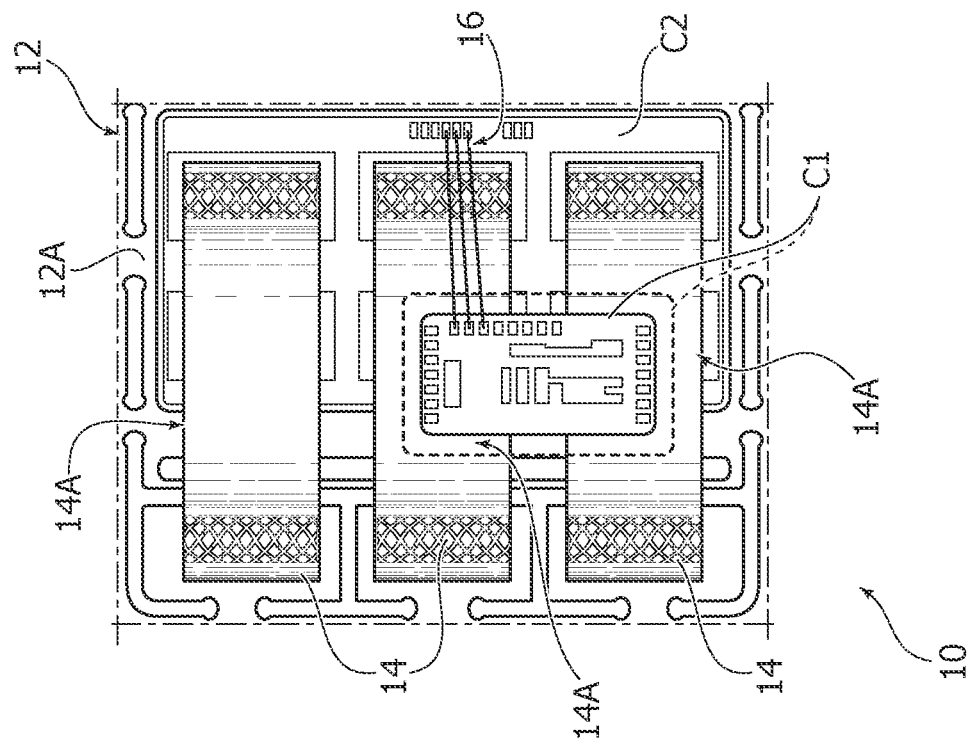
FIG. 5 is a plan view of still another semiconductor device according to embodiments of the present description.

FIG. 5 is exemplary of the possibility of mounting plural dice C1 on respective attachment surfaces 14A of two (not necessarily neighboring) ribbons 14.

Whatever the arrangement adopted for attachment, solutions as illustrated is FIGS. 3 to 5 illustrate (by direct comparison with FIGS. 1 and 2) the possibility of significantly reducing the overall X and Y dimensions of the resulting package.

This size reduction is beneficial in increasing the number of package positions available on a certain leadframe 12, with the possibility of reducing the final package cost.

Figure 6:
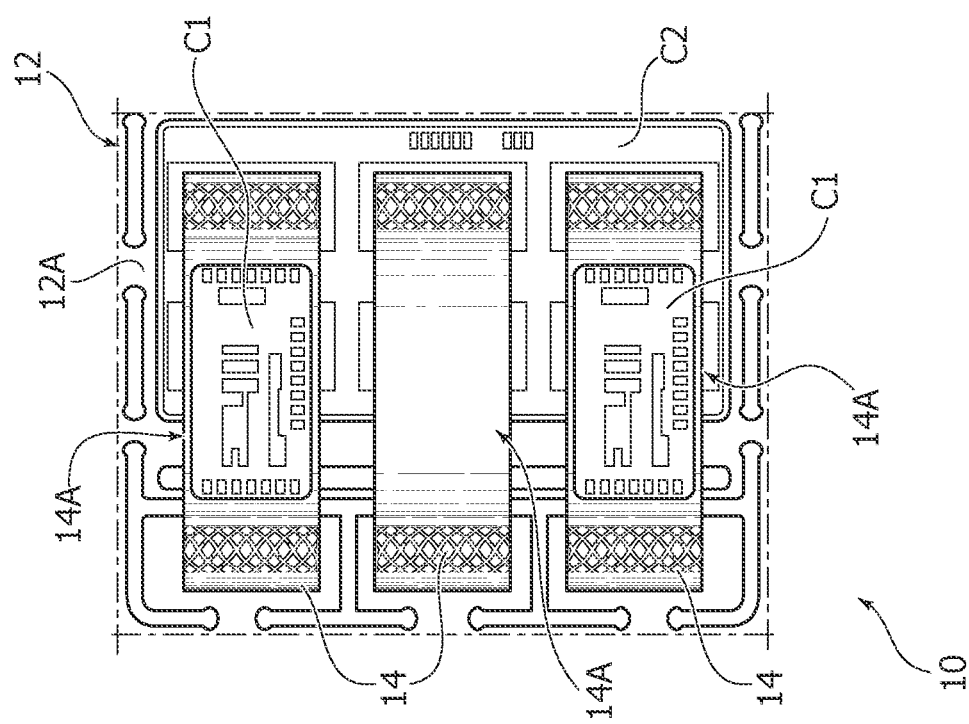
FIG. 6 is a plan view of a further semiconductor device according to embodiments of the present description.
Figure 7:
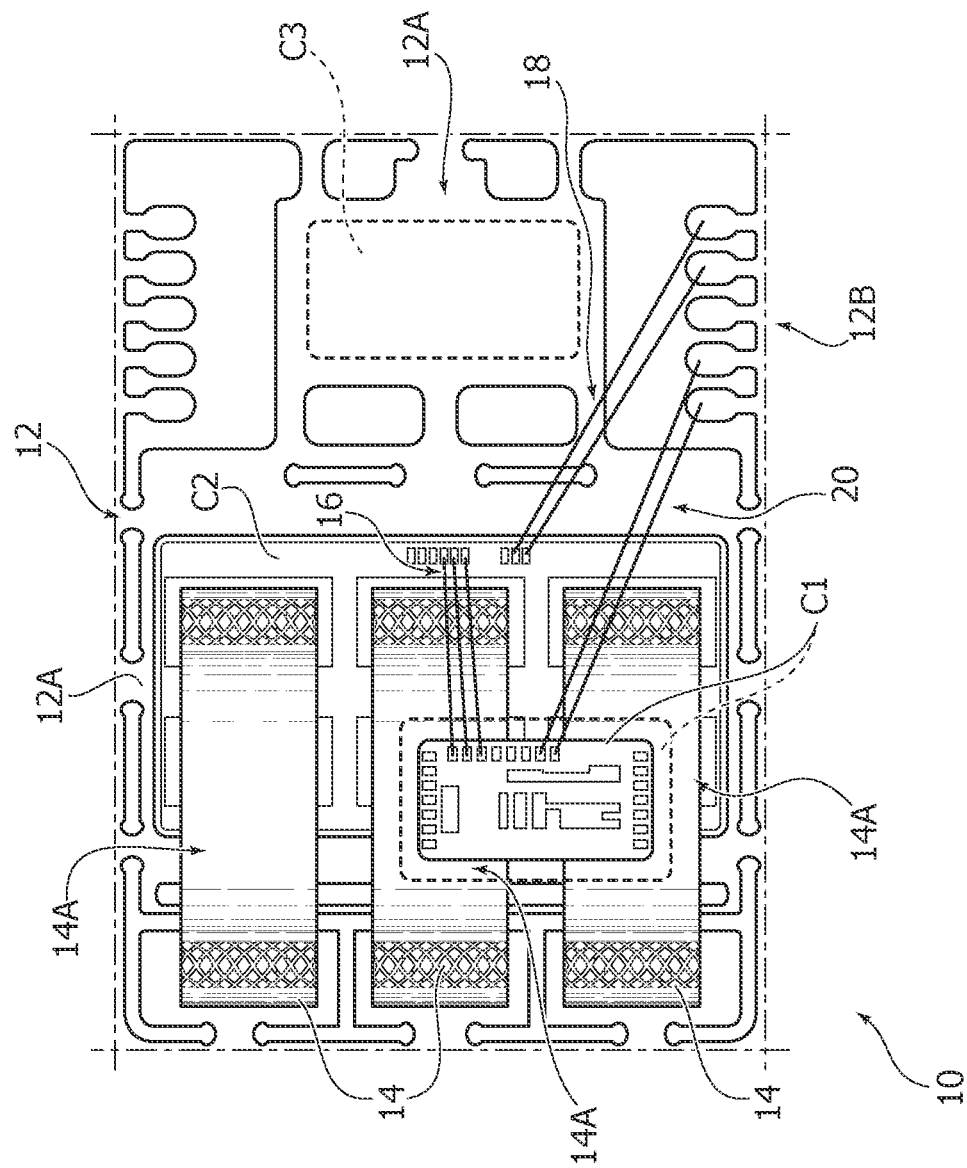
FIG. 7 is a plan view exemplary of a possible variant of the example presented in FIG. 6.

This possibility is exemplified by the comparison of FIGS. 6 and 7.

FIG. 6 is illustrative of the possibility (along the lines of, e.g., FIG. 4) attaching a die C1 astride or bridge-like between two ribbons 14 and exploiting the space advantage achieved via stacking the chips C1 and C2 to provide an overall reduction of the device package, by "eliminating" the right-hand portion of the substrate (lead frame) 12 in FIG. 1.

FIG. 7 is exemplary of the possibility of exploiting the space advantage achieved via stacking the chips C1 and C2 to retain the right-hand portion of the substrate (lead frame) 12 in FIG. 1 and exploit that portion of the substrate 12 for mounting one or more additional chips or dice (as indicated at reference C3) in dashed outline.

An essentially similar approach can be applied to the arrangement of FIG. 2, where the place "left free" by the die C1 mounted on one or more of the ribbons 14 on the left-hand side of the figure is possibly used to mount another die.

Also, FIG. 6 is exemplary of the possibility of electrically coupling the controller die C1 to the power die C2 via conventional wire bonding 16.

FIG. 7 illustrates, in addition to that possibility, the possibility of: electrically coupling the power die C2 to external leads 12B in the leadframe via further wire bonds 18; and electrically coupling the controller die C1 to external leads 12B in the leadframe via further wire bonds 20.

It will be appreciated that referring to the dice C1 and C2 as controller and power dice is purely exemplary: one or more embodiments may in fact apply irrespective of the nature and the type of the chips or dice involved.

While "functional" ribbons such as 14 (namely ribbons intended to provide high current flow channels or paths for the device 10) have been exemplified herein, certain examples may contemplate providing "dummy" ribbons (that is, ribbons that per se are not necessitated by any electrical connection) in order to facilitate arranging a chip or die thereon, possibly in a bridge-like arrangement with a "functional" ribbon. Such "dummy" ribbons may, for example, serve another function in the package such as heat dissipation.

Conventional metal materials (aluminum, copper or gold, for instance) as currently used in providing ribbons in semiconductor power devices were found to be adequate for the embodiments, that is, adequate for producing ribbons strong enough to support a semiconductor die such as C1 mounted thereon, with the capability of having planar portions such as 14A formed therein.

The examples herein have no appreciable impact on the assembly flow of the device 10.

In fact, after die bonding on one or more ribbons (as previously formed to provide power lines as desired) a wire bonding process (as exemplified by the wire bonding lines 16, 18 and 20 of FIG. 7) can be performed and continued with the other assembly steps (molding and encapsulation, singulation, and so on).

Without prejudice to the underlying principles, the details and the embodiments may vary, even significantly, with respect to what has been described by way of example only without departing from the scope of the embodiments.

The claims are an integral part of the technical teaching provided herein in respect of the embodiments.

The extent of protection is determined by the annexed claims.

The invention claimed is:

1. A method, comprising:
    arranging on a die pad in a substrate at least one first semiconductor die with at least one electrically conductive ribbon extending on the at least one first semiconductor die wherein the at least one first semiconductor die lies intermediate the substrate and the at least one electrically conductive ribbon; and
    attaching at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die.

2. The method of claim 1, wherein the at least electrically conductive ribbon has a wavy pattern connected by ultrasonic bond welds to the at least one first semiconductor die and further comprising providing at least one planar portion in the electrically conductive ribbon between ultrasonic bond welds and wherein attaching comprises attaching the at least one second semiconductor die on the at least one planar portion in the electrically conductive ribbon.

3. The method of claim 1, further comprising:
    providing in said substrate a further die pad adjacent to said die pad, and attaching at least one third semiconductor die on said further die pad.

4. The method of claim 1, further comprising:
using a first wire-bond pattern to mutually couple the at least one first semiconductor die and the at least one second semiconductor die in said stacked arrangement of the at least one second semiconductor die and the at least one first semiconductor die.

5. The method of claim 1, further comprising:
using a second wirebond pattern to couple said at least one first semiconductor die with electrically conductive formations in an array of electrically conductive formations provided in said substrate around said die pad.

6. The method of claim 1, further comprising:
using a third wirebond pattern to couple said at least one second semiconductor die with electrically conductive formations in an array of electrically conductive formations provided in said substrate around said die pad.

7. A method, comprising:
arranging on a die pad in a substrate at least one first semiconductor die with at least one electrically conductive ribbon extending on the at least one first semiconductor die wherein the at least one first semiconductor die lies intermediate the substrate and the at least one electrically conductive ribbon; and
attaching at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die;
wherein arranging comprises arranging a pair of electrically conductive ribbons to extend on the at least one first semiconductor die, wherein the first semiconductor die lies intermediate the substrate and said pair of electrically conductive ribbons; and
wherein attaching comprises attaching the at least one second semiconductor die bridge-like across said electrically conductive ribbons in said pair of electrically conductive ribbons to provide a stacked arrangement of the at least one second semiconductor die, with each electrically conductive ribbon in the pair of electrically conductive ribbons intermediate said at least one first semiconductor die and the at least one second semiconductor die.

8. The method of claim 7, further comprising using electrically conductive attach material to attach the at least one second semiconductor die bridge-like across said electrically conductive ribbons in said pair of electrically conductive ribbons.

9. A device, comprising:
a substrate comprising a die pad having arranged thereon at least one first semiconductor die with at least one electrically conductive ribbon extending on the at least one first semiconductor die wherein the at least one first semiconductor die lies intermediate the substrate and the at least one electrically conductive ribbon, and
at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die.

10. The device of claim 9, wherein the at least electrically conductive ribbon has a wavy pattern, and further comprising welding by ultrasonic bonding the wavy pattern to the at least one first semiconductor die, with at least one planar portion in the electrically conductive ribbon between ultrasonic bonds, wherein the at least one second semiconductor die is attached to the at least one planar portion in the electrically conductive ribbon.

11. The device of claim 9, further comprising:
a further die pad provided in said substrate adjacent said die pad; and
at least one third semiconductor die attaching on said further die pad.

12. The device of claim 9, further comprising:
a first wire-bond pattern mutually coupling the at least one first semiconductor die and the at least one second semiconductor die in said stacked arrangement of the at least one second semiconductor die and the at least one first semiconductor die.

13. The device of claim 9, further comprising:
a second wirebond pattern coupling said at least one first semiconductor die with electrically conductive formations in an array of electrically conductive formations provided in said substrate around said a die pad.

14. The device of claim 9, further comprising:
a third wirebond pattern coupling said at least one second semiconductor die with electrically conductive formations in an array of electrically conductive formations provided in said substrate around said a die pad.

15. A device, comprising:
a substrate comprising a die pad having arranged thereon at least one first semiconductor die with at least one electrically conductive ribbon extending on the at least one first semiconductor die wherein the at least one first semiconductor die lies intermediate the substrate and the at least one electrically conductive ribbon, and
at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die;
wherein said at least one electrically conductive ribbon comprises a pair of electrically conductive ribbons extending on the at least one first semiconductor die;
wherein the at least one first semiconductor die lies intermediate the substrate and the pair of electrically conductive ribbons; and
wherein said at least one second semiconductor die is attached bridge-like across said electrically conductive ribbons in said pair of electrically conductive ribbons to provide a stacked arrangement of the at least one second semiconductor die, with each electrically conductive ribbon in the pair of electrically conductive ribbons intermediate the at least one first semiconductor die and the at least one second semiconductor die.

16. The device of claim 15, further comprising electrically conductive attach material for attaching the at least one second semiconductor die bridge-like across said electrically conductive ribbons in said pair of electrically conductive ribbons.

17. A method, comprising:
arranging on a die pad in a substrate at least one first semiconductor die with at least one electrically conductive ribbon extending on the at least one first semiconductor die wherein the at least one first semiconductor die lies intermediate the substrate and the at least one electrically conductive ribbon; and attaching at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die;

wherein arranging comprises arranging on said substrate a pair of adjacent first semiconductor dice with a pair of electrically conductive ribbons, wherein each electrically conductive ribbon extends on one of the first semiconductor dice, wherein each one of the first semiconductor dice lies intermediate the substrate and a respective electrically conductive ribbon in the pair of electrically conductive ribbons; and wherein attaching comprises attaching the at least one second semiconductor die bridge-like across said electrically conductive ribbons in said pair of electrically conductive ribbons to provide a stacked arrangement of the at least one second semiconductor die, with each electrically conductive ribbon in the pair of electrically conductive ribbons intermediate a respective one of the first semiconductor dice and one end of the second semiconductor die.

18. The method of claim 17, further comprising using electrically conductive attach material to attach the at least one second semiconductor die bridge-like across said electrically conductive ribbons in said pair of electrically conductive ribbons.

19. The method of claim 17, wherein said electrically conductive ribbons are mutually electrically coupled through the least one second semiconductor die.

20. A device, comprising:

a substrate comprising a die pad having arranged thereon at least one first semiconductor die with at least one electrically conductive ribbon extending on the at least one first semiconductor die wherein the at least one first semiconductor die lies intermediate the substrate and the at least one electrically conductive ribbon, and at least one second semiconductor die on the at least one electrically conductive ribbon to provide on said die pad a stacked arrangement of the at least one second semiconductor die and the at least one first semiconductor die with the at least one electrically conductive ribbon intermediate the at least one first semiconductor die and the at least one second semiconductor die;

wherein said at least one first semiconductor die comprises a pair of adjacent first semiconductor dice arranged on said substrate;

wherein said at least one electrically conductive ribbon comprises a pair of electrically conductive ribbons, each electrically conductive ribbon extending on one of the first semiconductor dice;

wherein each one of the first semiconductor dice lies intermediate the substrate and a respective electrically conductive ribbon in the pair of electrically conductive ribbons; and wherein said at least one second semiconductor die is attached bridge-like across said electrically conductive ribbons in said pair of electrically conductive ribbons to provide a stacked arrangement of the at least one second semiconductor die, with each electrically conductive ribbon in the pair of electrically conductive ribbons intermediate a respective one of the first semiconductor dice and one end of the second semiconductor die.

21. The device of claim 20, further comprising electrically conductive attach material for attaching the at least one second semiconductor die bridge-like across said electrically conductive ribbons in said pair of electrically conductive ribbons.

22. The device of claim 20, wherein said electrically conductive ribbons said pair of electrically conductive ribbons are mutually electrically coupled through the least one second semiconductor die.

* * * * *